(12) United States Patent
Musaka

(10) Patent No.: US 6,607,790 B1
(45) Date of Patent: *Aug. 19, 2003

(54) METHOD OF FORMING A THIN FILM FOR A SEMICONDUCTOR DEVICE

(75) Inventor: Katsuyuki Musaka, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/888,499

(22) Filed: Jul. 7, 1997

Related U.S. Application Data

(63) Continuation of application No. 08/538,056, filed on Oct. 2, 1995, now abandoned, which is a continuation of application No. 08/184,331, filed on Jan. 19, 1994, now abandoned.

(30) Foreign Application Priority Data

Apr. 13, 1993 (JP) .............................................. 5-086366

(51) Int. Cl.$^7$ .............................. H05H 1/46; B05D 5/12; H01L 21/473
(52) U.S. Cl. ...................... 427/563; 427/574; 427/579; 427/575; 438/789
(58) Field of Search ................................. 427/563, 574, 427/578, 579, 575, 255.1; 438/788, 789

(56) References Cited

U.S. PATENT DOCUMENTS

| | | | |
|---|---|---|---|
| 4,282,267 A | * 8/1981 | Küyel | 427/563 |
| 4,300,989 A | 11/1981 | Chang | 104/164 |
| 4,461,783 A | * 7/1984 | Yamazaki | 427/563 |
| 4,668,365 A | 5/1987 | Foster et al. | 204/192.23 |
| 4,778,721 A | * 10/1988 | Sliemers | 427/578 |
| 4,818,563 A | * 4/1989 | Ishihara et al. | 427/574 |
| 4,872,947 A | * 10/1989 | Wang et al. | 427/574 |
| 4,894,352 A | * 1/1990 | Lane et al. | 427/578 |
| 5,013,691 A | 5/1991 | Lory et al. | 437/238 |
| 5,206,060 A | * 4/1993 | Balian et al. | 427/578 |
| 5,215,787 A | 6/1993 | Homma | 427/248.1 |
| 5,223,457 A | * 6/1993 | Mintz et al. | 427/574 |
| 5,275,977 A | 1/1994 | Otsubo et al. | 437/235 |
| 5,279,865 A | * 1/1994 | Chebi et al. | 427/574 |
| 5,288,518 A | * 2/1994 | Homma | 427/574 |
| 5,356,722 A | * 10/1994 | Nguyen et al. | 427/574 |
| 5,429,995 A | * 7/1995 | Nishiyama et al. | 427/563 |
| 5,453,305 A | * 9/1995 | Lee | 427/563 |
| 5,492,736 A | * 2/1996 | Laxman et al. | 427/579 |
| 5,571,571 A | * 11/1996 | Musaka et al. | 427/574 |

FOREIGN PATENT DOCUMENTS

| | | | |
|---|---|---|---|
| JP | 61-276977 | 12/1986 | ............ C23C/16/50 |
| JP | 3-268429 | 11/1991 | ......... H01L/21/316 |
| JP | 4-341568 | 11/1992 | ............ C23C/16/40 |
| WO | PCT/US92/04103 | 11/1992 | ............ C23C/16/00 |

OTHER PUBLICATIONS

R.F. Graf, *Modem Dictionary of Electronics*; Howard W. Samst Co, Inc, Indianapolis, Indiana, 1977 (no month) p. 46.*

Hermann et al, "Refractive Index of Doped and Undoped PCVD Bulk Silica", Mat. Res. Bull., vol. 24, 1989, pp1083–1097 no month.

Webb et al, "Silicon Dioxide Films Produced by PECVD of TEOS and TMCTS", Proc. 2nd Intern'l ULSI Science and Technol. Symp. ECS Proc, 1989, pp571–585 no month.

Yu et al, "Step Coverage Study of PETEOS Deposition for Intermetal Dielectric Applications" VMIC Conf, 1990 IEEE, Jun. 12–13, 1990 pp 166–172.

* cited by examiner

*Primary Examiner*—Marianne Padgett
(74) *Attorney, Agent, or Firm*—Birgit Morris

(57) ABSTRACT

The present invention relates to a plasma-enhanced chemical vapor deposition (PECVD) method of depositing a thin layer of a material, such as silicon dioxide, on the surface of a body, such as a semiconductor substrate. The method includes forming in a deposition chamber a plasma by means of two electrical power sources of different frequencies. A reaction gas is admitted into the deposition chamber and subjected to the plasma. The reaction gas is a mixture of tetraethylorthosilicate and a halogen gas, such as a gas of fluorine, chlorine or bromine. The reaction gas is reacted by the plasma to cause the material of the gas to deposit on the body which is within the chamber. This results in a deposited layer having a smoothly tapered surface even when the surface of the body possesses valleys and mesas, and thus prevents the formation of voids.

16 Claims, 4 Drawing Sheets

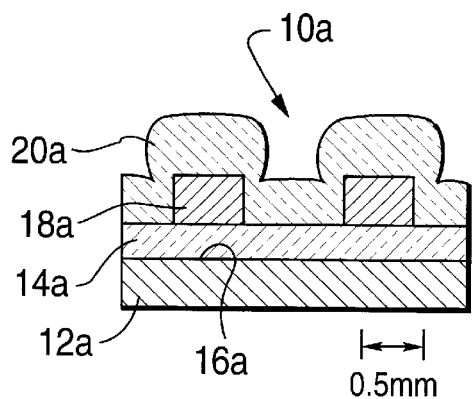
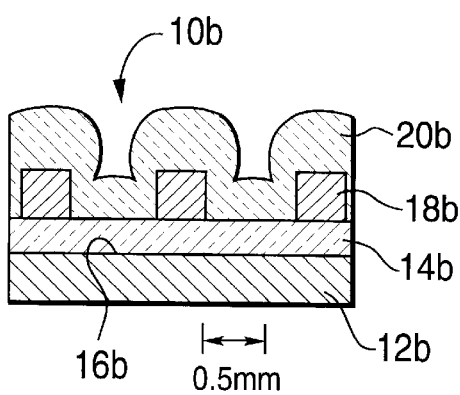
FIG. 1A
PRIOR ART
FIG. 1B
PRIOR ART
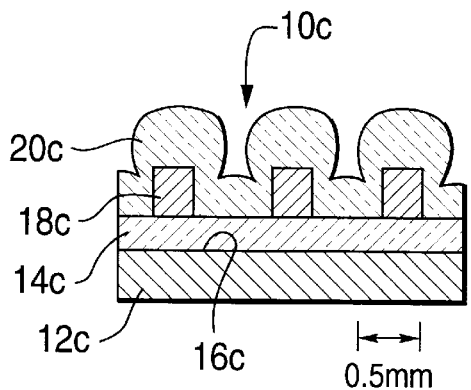
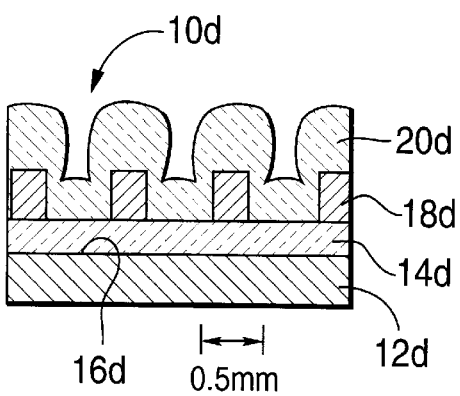
FIG. 1C
PRIOR ART
FIG. 1D
PRIOR ART
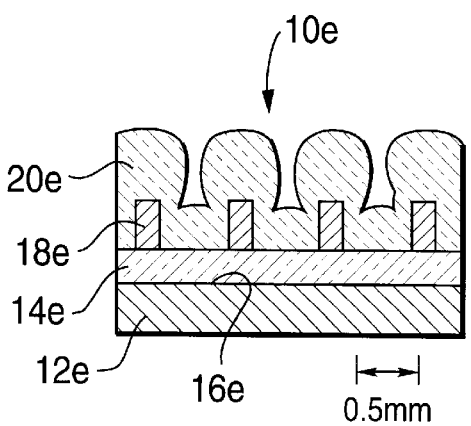
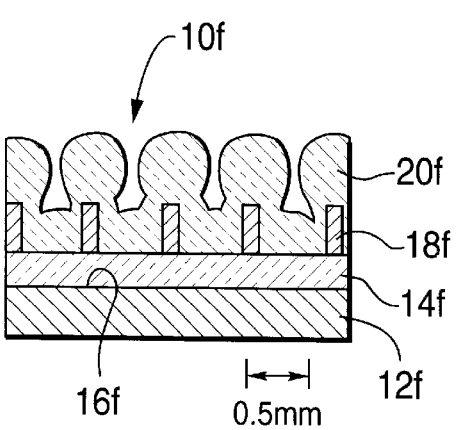
FIG. 1E
PRIOR ART
FIG. 1F
PRIOR ART

METHOD OF FORMING A THIN FILM FOR A SEMICONDUCTOR DEVICE

This is a continuation of U.S. application Ser. No. 08/538,056 filed Oct. 2, 1995 now abandon, which is a continuation of U.S. application Ser. No. 08/184,331 filed Jan. 19, 1994, now abandoned.

FIELD OF THE INVENTION

The present invention relates to a method of forming a thin film for a semiconductor device, and, more particularly, to a plasma-enhanced chemical vapor deposition (CVD) method for forming a thin film on the surface of a body, such as a semiconductor substrate.

BACKGROUND OF THE INVENTION

One method which has been used to form a thin film on the surface of a body, such as a semiconductor substrate, is the plasma-enhanced chemical vapor deposition (CVD) technique. In this technique, the body is placed in a reaction chamber and a reaction gas is introduced into the chamber. The gas is activated by means of a plasma discharge created in the chamber. This causes the reaction gas to react and deposit a thin film of a material on the surface of the body.

The methods that have been used on a practical basis for the purpose of creating a plasma in a reaction chamber for plasma-enhanced CVD include a method in which an electrical power source with a frequency of 13.56 MHz or 400 KHz, or the like, is applied to a pair of opposed electrodes which are within the reaction chamber. The speed of deposition and the quality of the deposited thin film are controlled by adjusting the power of this electrical power source. Another method of creating the plasma in the reaction chamber uses a microwave radiation of 1.54 GHz which is introduced into the reaction chamber by means of a wave guide. This method is known as ECR plasma CVD. In the plasma enhanced CVD techniques, gases such as tetraethylorthosilicate (TEOS) gas and silane ($SiH_4$) have been used as reaction gases to cause a thin film of SiO or SiON to deposit on the surface of a semiconductor substrate.

With the recent development of high density semiconductor integrated circuit devices (VLSIs), there has been created a crucial need for techniques that can create ultrafine configurations in the submicron range. In order to respond to this demand, the possibility of using conventional techniques to create submicron configurations was considered by conducting an empirical study on the configuration of thin films produced by conventional plasma-enhanced CVD methods.

Referring to FIGS. 1(a) to 1(f), there is shown sectional views of semiconductor devices 10a–10f comprising a substrate 12a–12f having a layer 14a–14f of an insulating material, such as silicon dioxide, on a surface 16a–16f thereof. A plurality of spaced, parallel strips 18a–18f of a conductive material, such as aluminum, are on the insulating layer 14a–14f, and are coated with a layer 20a–20f of an insulating material, such as silicon dioxide. The conductive strips 18a–18f are of different widths with the strip 18a being the widest and the strip 18f being the narrowest. Also, the spacing between the conductive strips 18a–18f vary with the strips 18a being spaced apart the greatest distance and the strips 18f being spaced apart the closest distance. The insulating coatings 20a–20f were formed by a conventional plasma-enhanced CVD (referred to hereinafter as "PECVD") wherein a reaction gas of $SiH_4$ was introduced in a reaction chamber and a plasma was created in the reaction chamber by applying a single 13.56 MHz high-frequency electrical power source between a pair of opposing electrodes in the chamber. As can be seen in FIGS. 1(a) to 1(f), the sides of the silicon dioxide coating 20a–20f have a cross-sectional configuration formed so as to posses roundness in the form of protrusions. More specifically, the thin film 20a–20f near the upper side of the aluminum strip 18a–18f is thicker than the portion of the coating 20a–20f near the bottom of the aluminum strip 18a–18f. This results in the problem of gaps being created near the bottom of the aluminum strips 18a–18f. This is especially serious in high-density strips (wiring) on the submicron level, where the gap spacing between the aluminum strips is reduced as shown in FIGS. 1(e) and 1(f).

Referring to FIGS. 2A to 2F, there are shown sectional views of a semiconductor device 22a–22f which is similar to the semiconductor device 10a–10f of FIGS. 1A to 1F. The semiconductor device 22a–22f comprises a substrate 24a–24f of a semiconductor material, such as silicon, having a layer 26a–26f of an insulating material, such as silicon dioxide, on a surface 28a–28f thereof. A plurality of spaced, parallel strips 30a–30f of a conductive material, such as aluminum, are on the insulating layer 26a–26f. The conductive strips 30a–30f are coated with a layer 32a–32f of an insulating material, such as silicon dioxide. The conductive strips 30a–30f are of different widths, with the conductive strip 30a being the widest and the conductive strip 30f being the narrowest. Also, the spacing between the conductive strips 30a–30f varies with the conductive strips 30a being spaced apart the greatest distance and the conductive strips 30f being spaced apart the least distance.

The insulating coatings 32a–32f were formed by PECVD using tetraethylorthosilicate (TEOS) as the reaction gas. The plasma was created in the reaction chamber by simultaneously applying a 13.56 MHz high-frequency electrical power source and a 400 kHz low-frequency electrical power source between opposing electrodes in the chamber. When these electrical power sources of two frequencies are utilized, it is possible to enhance the quality of the thin film and the speed with which it is created.

As can be seen from FIGS. 2A to 2F, the configuration of the sidewalls of the silicon dioxide thin film 32a–32f has little or no curvature when compared to the configuration of the silicon dioxide thin films 20a–20f shown in FIGS. 1A to 1F. Thus, this technique can be said to make a major contribution to enhancing the control of the formed thin film. However, as is shown in FIGS. 5(e) and 5(f), the reduction in the gaps is insufficient in the creation of high density thin films in the submicron range at which the distance between the aluminum strips 30e and 30f decreases. Also, it is difficult with the above conventional techniques to respond to the demand for the creating of higher densities. Therefore, it is desirable to have a method of depositing a thin film for a semiconductor device than will provide good coatings even with high density devices.

SUMMARY OF THE INVENTION

The present invention is directed to a method of forming a thin film on a substrate of a semiconductor device wherein the substrate is subjected to a mixture of tetraethylorthosilicate gas and a halogen gas, and a plasma is formed by means of a plurality of electrical power sources of different frequencies.

Viewed from another aspect, the present invention is directed to a method of forming a thin film on a substrate of a semiconductor device wherein the substrate is placed within a reaction chamber and a plasma is created in the chamber by means of a plurality of electrical power sources of different frequencies. A reaction gas is introduced into the reaction chamber and subjected to the plasma to cause the gas to react and deposit a layer on the substrate. The reaction gas is a mixture of tetraethylorthosilicate gas and a halogen gas.

BRIEF DESCRIPTION OF THE DRAWINGS

FIGS. 1A to 1F are sectional views of semiconductor devices formed by one type of a convention plasma-enhanced CVD method with the devices having conductive strips of various widths and various spacings.

DETAILED DESCRIPTION

The present invention, in general, is directed to a method of forming a thin film of a material on the surface of a body, such as a substrate of a semiconductor device, by a plasma enhanced CVD technique. In the method of the present invention, a plasma is created within a reaction chamber by means of two electrical power sources having different frequencies. A high frequency of about 13.56 MHz and a low frequency of between 50 KHz and 1000 KHz, preferably about 400 KHz, are used. A reaction gas comprising a mixture of tetraethylorthosilicate (TEOS) gas and a halogen gas selected from a fluorine, a chlorine or a bromine gas is introduced into the reaction chamber and subjected to the plasma. The ratio of the gases can be 1 part TEOS to 1 part halogen gas (1:1) to 1 part TEOS to 3 parts halogen gas (1:3). Increasing the amount of halogen gas decreases the deposition rate so that the 1:1 ratio is preferred for production purposes. The plasma causes the reaction gas to react and deposit a layer on the surface of the body. The fluorine gas can be $CF_4$, $C_2F_6$, $NF_3$, $CHF_3$, $CH_3F$, $F_2$, $SF_6$ or the like. The chlorine gas can be $CCl_4$, $Cl_2$, HCl or the like. The bromine gas can be HBr or the like.

The thin film deposited by the method of the present invention when deposited over strips of another material, such as conductive strips, so as to possess valleys and mesas, has been found to have a smooth tapering configuration. This results in no voids being created. Also, since the sidewalls of the deposited layer have superior fineness, the method of the present invention is superior in terms of control it affords over film quality. In addition, when the film is formed using a fluorine containing gas, the deposited layer also includes fluorine. This fluorine in an insulating film, such as silicon dioxide, lowers the dielectric constant of the film. This, in turn, enhances the electrical properties of any transistors formed using the method of the present invention.

Figure 2A:
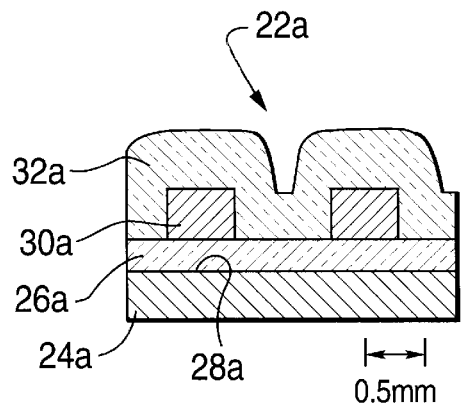
FIGS. 2A to 2F are sectional views of semiconductor devices formed by another type of conventional plasma-enhanced CVD method with the devices having conductive strips of various widths and various spacings.
Figure 2B:
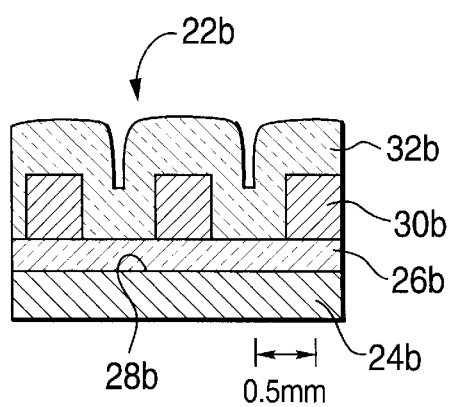
Figure 2C:
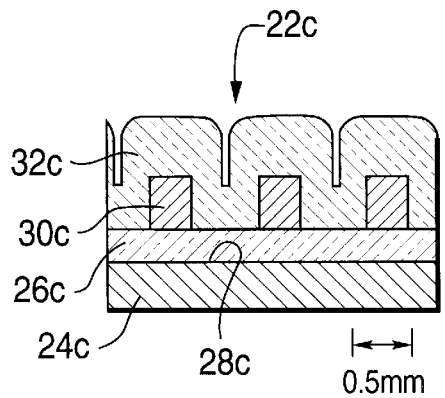
Figure 2D:
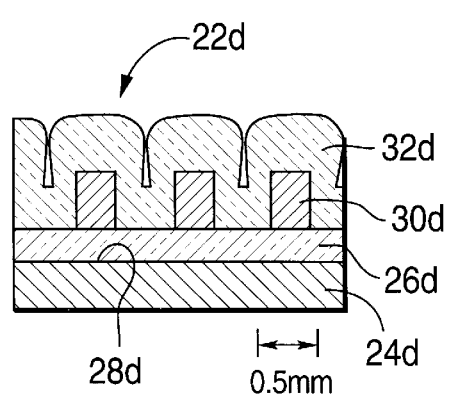
Figure 2E:
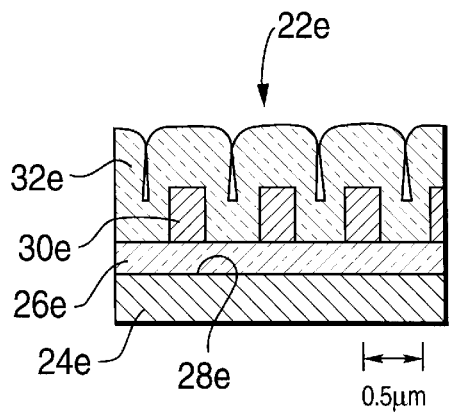
Figure 2F:
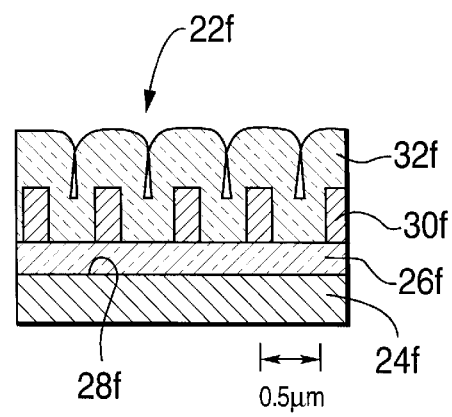
Figure 3:
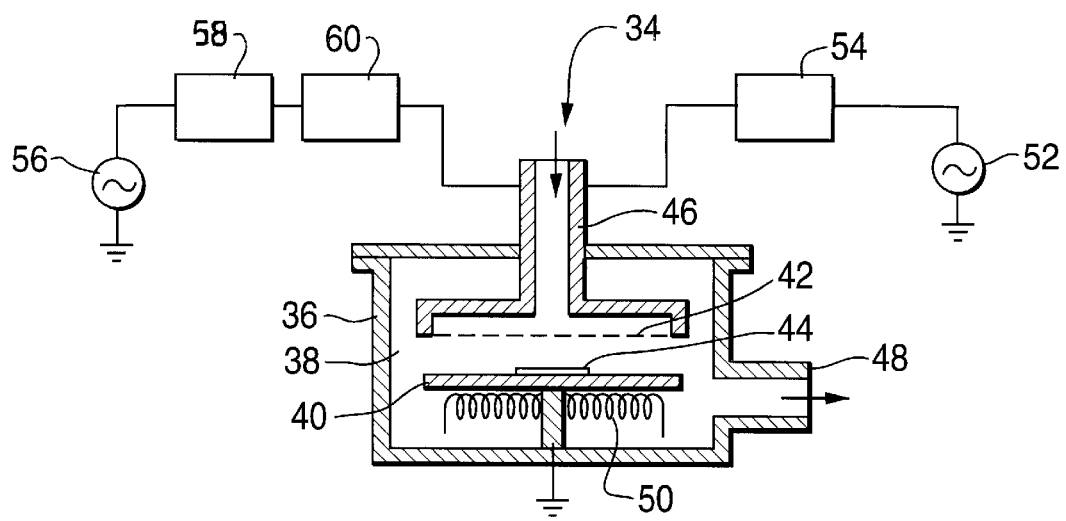
FIG. 3 is a schematic sectional view of one form of a deposition apparatus which can be used to carry out the method of the present invention.

Referring now to FIG. 3, there is shown one type of a deposition apparatus 34, which can be used to carry out the method of the present invention. Deposition apparatus 34 comprises an insulated deposition vessel 36 having an airtight reaction chamber 38. A pair of electrodes 40 and 42 are in spaced, substantially parallel relation within the reaction chamber 38. The electrode 40 serves as a support for a body 44, such as a semiconductor substrate, which is to be coated, and is connected to ground potential. The electrode 42 has an inlet tube 46 extending therefrom and out of the vessel 36 through which a reaction gas can be admitted into the reaction chamber 38. An outlet tube 48 extends from a side of the reaction vessel 36 to permit gases to be exhausted from the reaction chamber 38. A heater 50 is provided along the electrode 40 to control the temperature of the body 44 being coated.

The electrode 42 is connected to a first power source 52 for providing a high frequency, typically about 13.56 MHz, oscillation to the electrode 42. An impedance matching circuit 54 is provided between the high frequency power source 52 and the electrode 42. The electrode 42 is also connected to a second power source 56 for providing a lower frequency, typically about 400 kHz, oscillation to the electrode 42. Between the low frequency power source 56 and the electrode 42 are an impedance matching circuit 58 and a high frequency cut-off filter circuit 60 for blocking the passage of any high frequency components. By simultaneously applying to the electrode 42 electrical power of two different frequencies, i.e., high and low, a plasma is created within the reaction chamber 38.

To deposit a layer of a material, such as silicon dioxide, on the surface of a body 44, such as a semiconductor substrate, in the apparatus 34 using the method of the present invention, the body 44 is placed in the chamber 38 and on the electrode 40. A reaction gas consisting of a mixture of a fluorine gas, such as $NF_3$, and TEOS gas is introduced into the chamber 38 through the inlet tube 46. The power sources 52 and 56 are turned on to simultaneously provide a high frequency power and a lower frequency power to the electrodes 40 and 42. The ratio between the power outputs from the high frequency source 52 and the lower frequency source 56 is suitably adjusted to form a plasma within the chamber 38 and between the electrodes 40 and 42. The reaction gas is subjected to the plasma causing the reaction gas to react and deposit a thin film of silicon dioxide on the surface of the body 44.

Referring to FIGS. 4A to 4F, there are shown sectional views of semiconductor devices 62a–62f formed by the method of the present invention in an apparatus 34 described above. Each of the semiconductor devices 62a–62f comprises a semiconductor substrate 64a–64f, typically of silicon, having on a surface 66a–66f thereof a layer 68a–68f of silicon dioxide. On the silicon dioxide layer 68a–68f are a plurality of spaced, substantially parallel strips 70a–70f of aluminum. The aluminum strips 70a–70f are similar to the conductive wiring of an integrated circuit. A layer 72a–72f of silicon dioxide is coated over the aluminum strips 70a–70f and the surface of the silicon dioxide layer 68a–68f between the aluminum strips 70a–70f. The aluminum strips 70a–70f vary in width and spacing with the aluminum strips 70a in FIG. 4(a) being the widest and having the most widest spacing therebetween, and the aluminum strips 70f in FIG. 4F being the narrowest and being the closest spaced.

The silicon dioxide layer 72a–72f was coated over the aluminum strips 70a–70f by the method of the present invention as described above. For this method, the pressure in the reaction chamber 38 was 5 Torr, and the spacing between the electrodes 40 and 42 was 250 mils. A flow of TEOS and a carrier gas, helium, at 480 sccm was provided in the reaction chamber 38. A flow of $C_2F_6$ at 400 sccm and a flow of oxygen at 700 sccm was also provided in the reaction chamber 38. A high frequency of 13.56 MHz at a power of 80 watts was applied to the electrode 42, and a low frequency of 400 KHz at a power of 90 watts was also applied to the electrode 42. Each of FIGS. 4A to 4F are cross-sectional views of tracings made of the outlines shown in microphotographs of the longitudinal configurations of the actual devices, with the height and width of the devices being indicated by the unit scale in the figures.

Figure 4A:
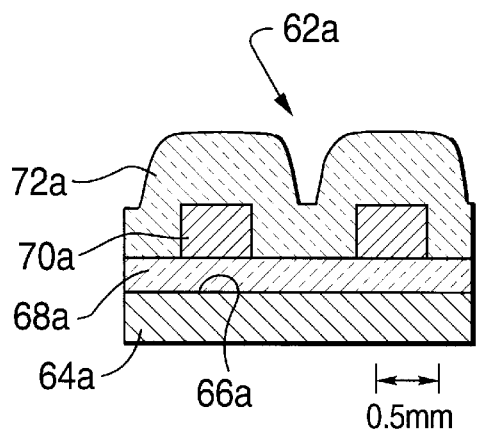
FIGS. 4A to 4F are sectional views of semiconductor devices formed by the method of the present invention with the devices having conductive strips of different widths and different spacings.
Figure 4B:
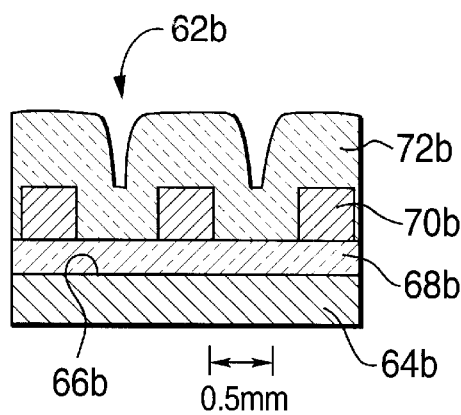
Figure 4C:
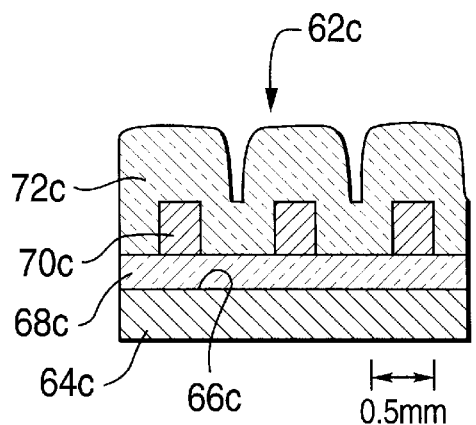
Figure 4D:
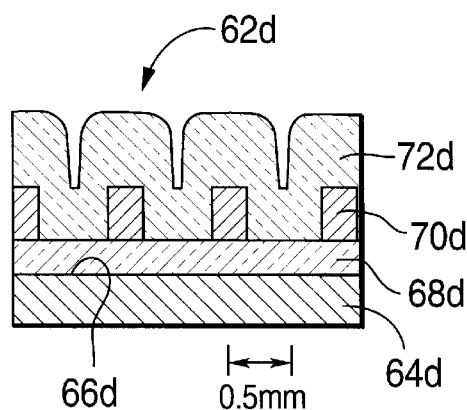
Figure 4E:
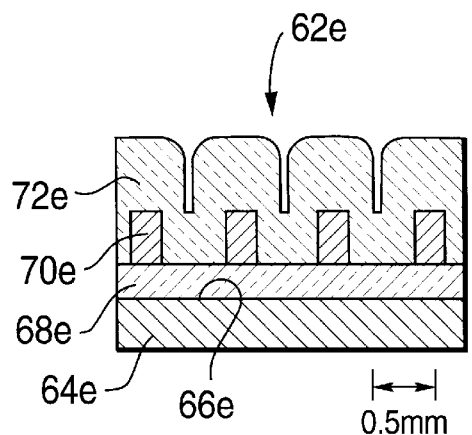
Figure 4F:
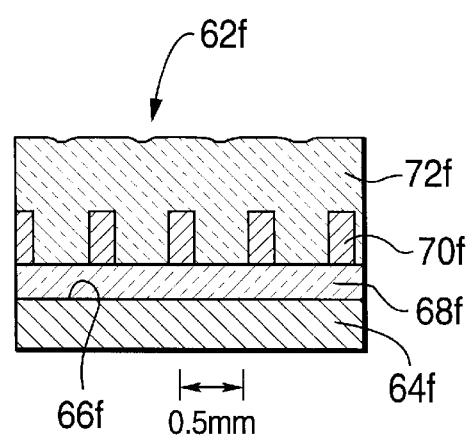

When the widths of the respective aluminum strips and of the corresponding spaces between the strips are comparatively large, as shown in FIGS. 4A to 4D, the sidewalls of the silicon dioxide layer 72a–72d has a smoothly tapered configuration, and the creation of gaps is therefore eliminated. However, even when the widths of the respective aluminum strips and of the corresponding spaces between the strips is in the submicron range, as shown in FIG. 4E, the sidewall configuration of the silicon dioxide layer 72e is flat, and the creation of voids is greatly reduced. When the width of the respective aluminum strips and the corresponding spaces therebetween is reduced even more in the submicron range, as shown in FIG. 4F, the spaces between the aluminum strips 70f are buried by the silicon dioxide layer 72f, and the problem of gap creation is completely solved. Since the sidewalls obtained with the configurations shown in FIGS. 4E and 4F have a fine compositional structure, an enhancement of the quality is achieved. It is believed that the reason that voids are reduced and that the walls of the silicon dioxide thin film deposited by the method of the present invention have a tapered configuration is that at the same time that the deposit is formed on the upper surface of the aluminum strips and the silicon dioxide layer due to the TEOS gas, the deposited thin film is subjected to etching by the fluorine gas. In addition, since the deposited silicon dioxide film includes fluorine, its dielectric constant is lowered. Thus, in cases such as those wherein the aluminum wiring is used as wiring between gates of MOSFETs for the purpose of connecting the gate electrodes of MOSFETs, it is possible to realize a MOSFET with good electrical characteristics.

Figure 5:
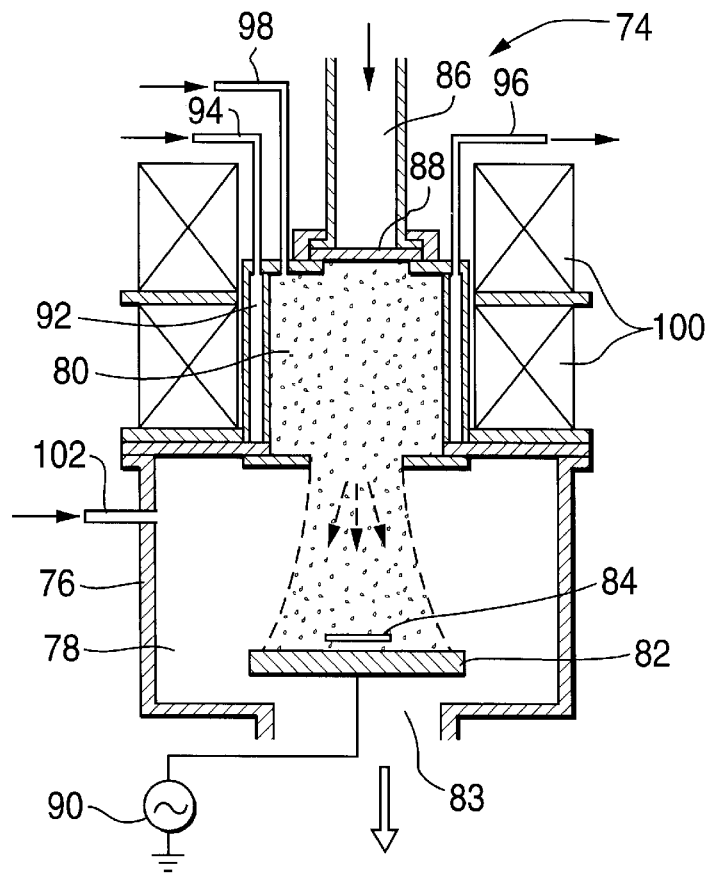
FIG. 5 is a schematic sectional view of another form of a deposition apparatus which can be used to carry out the method of the present invention.

Referring to FIG. 5, there is shown another apparatus 74 which can be used to carry out the method of the present invention. Apparatus 74 is an ECR plasma CVD device and comprises a reaction vessel 76 having a deposition chamber 78 and a plasma creation chamber 80 over and opening into the deposition chamber 78. An electrode 82 is within the deposition chamber and is adapted to support a body 84, such as a semiconductor substrate, to be coated. A microwave wave guide tube 86 extends to the top of the plasma creation chamber 80 and is mounted on a window 88 over an opening in the plasma creation chamber 80. The wave guide tube 86 is adapted to deliver microwave power, typically about 2.45 GHz, to the plasma creation chamber 80. The electrode 82 is connected to a high frequency, typically about 13.56 MHz, power source 90.

A cooling chamber 92 surrounds the plasma creation chamber 80. Inlet and outlet pipes 94 and 96 respectively extend into and away from the cooling chamber 92 and are adapted to provide a flow of a cooling fluid through the cooling chamber. A gas inlet tube 98 extends into the plasma creation chamber 80 and is adapted to deliver a plasma forming gas into the plasma creation chamber 80. A set of magneto coils 100 surround the plasma creation chamber 80. A gas inlet tube 102 extends into the deposition chamber 78 and a gas exhaust opening is also in the deposition chamber 78.

To carry out the method of the present invention in the apparatus 74, a body 84 to be coated is placed on the electrode 82. The microwave power is fed into the plasma forming chamber 80 simultaneously with the high frequency power being applied to the electrode 82. A plasma forming gas is fed into the plasma forming chamber 80 where a plasma is formed by the application of the two powers of different frequencies. The plasma is drawn from the plasma forming chamber 80 into the deposition chamber 78. The reaction gas, a mixture of TEOS gas and a halogen gas, is fed into the vessel 76 where it is reacted by the plasma to form silicon dioxide which deposits on the surface of the body 84.

Thus, there is provided by the present invention a method of depositing a layer of a material, such as silicon dioxide, on the surface of a substrate which layer, even if the substrate has a surface possessing valleys and mesas, has a smoothly tapered configuration so as to prevent the formation of voids. In addition, because the sidewalls of the deposited layer have good fineness, it is possible to offer a method that is superior in terms of its ability to control the film quality. Also, since the deposition gas includes a halogen gas, such as a fluorine, chlorine or bromine gas, it provides a film which contains a halogen and which has a low dielectric constant. This can provide a transistor having enhanced electrical properties. Although the specific examples of the method of the present invention given above have described a fluorine gas being used in the reaction gas, a chlorine or bromine gas provides the same results including the lower dielectric constant.

As previously described with regard to FIGS. 1A to 1F, the use of $SiH_4$ and a single high frequency power source does not provide a deposited film have the surface characteristics of that deposited by the method of the present invention. Also, as previously described with regard to FIGS. 2A to 2F, the use of TEOS as the reaction gas and a single high frequency power source does not provide a deposited film have the surface characteristics of that deposited by the method of the present invention. In addition, it has been experimentally found that when a plasma is created by applying only a 13.56 MHz high frequency electrical power to an electrode and the reaction gas is a mixture of TEOS and a fluorine gas, the deposited silicon dioxide film has sidewalls that do not take on a fine compositional structure, but become brittle. Thus, using either a single gas with either one or two power sources, or using a mixture of gases with a single power source does not provide a deposited film having the same characteristics as a film deposited by the method of the present invention in which two power sources of different frequencies is used along with a reaction gas comprising a mixture of TEOS and a halogen gas.

What is claimed is:

1. A plasma enhanced chemical vapor deposition process for depositing a silicon oxide film containing a halogen from a mixture of plasma precursor gases including tetraethoxysilane and a halogen-containing gas onto a substrate mounted in a vacuum deposition chamber which comprises forming a plasma in said chamber from said precursor gases by means of a plurality of power sources connected to said chamber operated simultaneously, each power source having a different frequency.

2. A process according to claim 1 wherein a first power source has a frequency of about 13.56 MHz and a second power source has a frequency between about 50 KHz and 1000 KHz.

3. A process according to claim 1 wherein one of said power sources is a source of microwave power.

4. A process according to claim 1 wherein said halogen-containing gas includes a fluorine compound.

5. A process according to claim 4 wherein said halogen-containing gas is selected from the group consisting of $CF_4$, $C_2F_6$, $NF_3$, $HF$, $CHF_3$, $F_2$, and $SF_6$.

6. A process according to claim 1 wherein said halogen-containing gas includes a chlorine compound.

7. A process according to claim 4 wherein said halogen-containing gas is selected from the group consisting of $CCl_4$, $Cl_2$ and $HCl$.

8. A process according to claim 1 wherein said halogen-containing gas includes a bromine compound.

9. A process according to claim 8 wherein said halogen-containing gas is HBr.

10. A process according to claim 1 wherein said precursor gas mixture further includes oxygen.

11. A process according to claim 1 wherein the pressure in said deposition chamber during deposition is about 5 Torr.

12. A method of depositing silicon oxide containing a halogen in openings having an aspect ratio of about 1.0 or higher without forming voids in a parallel plate plasma enhanced chemical vapor deposition reactor which comprises passing a precursor gas mixture including tetraethoxysilane and a halogen-containing compound into said reactor containing a substrate having stepped topography, and forming a plasma in the reactor by means of a plurality of power sources connected to said reactor, said power sources operating simultaneously, and having different frequencies.

13. A method according to claim 12 wherein said power sources include a first power source having a frequency of 13.56 MHz and a second power source having a frequency between 50 KHz and 1000 KHz.

14. A method according to claim 12 wherein said halogen-containing gas includes a fluorine compound.

15. A method according to claim 14 wherein oxygen is additionally added to said plasma precursor gas mixture.

16. A method according to claim 12 wherein the pressure in the reactor is about 5 Torr.

* * * * *